(12) United States Patent
Kim et al.

(10) Patent No.: US 10,847,199 B2
(45) Date of Patent: Nov. 24, 2020

(54) MRAM ARRAY HAVING REFERENCE CELL STRUCTURE AND CIRCUITRY THAT REINFORCES REFERENCE STATES BY INDUCED MAGNETIC FIELD

(71) Applicant: Spin Memory, Inc., Fremont, CA (US)

(72) Inventors: Kuk-Hwan Kim, San Jose, CA (US); Kadriye Deniz Bozdag, Sunnyvale, CA (US); Eric Michael Ryan, Fremont, CA (US)

(73) Assignee: SPIN MEMORY, INC., Fremont, CA (US)

( * ) Notice: Subject to any disclaimer, the term of this patent is extended or adjusted under 35 U.S.C. 154(b) by 0 days.

(21) Appl. No.: 16/362,329

(22) Filed: Mar. 22, 2019

(65) Prior Publication Data

US 2020/0302983 A1 Sep. 24, 2020

(51) Int. Cl.
*G11C 11/16* (2006.01)
*H01L 43/08* (2006.01)
*H01L 27/22* (2006.01)

(52) U.S. Cl.
CPC ........ *G11C 11/161* (2013.01); *G11C 11/1673* (2013.01); *G11C 11/1675* (2013.01); *H01L 27/224* (2013.01); *H01L 43/08* (2013.01)

(58) Field of Classification Search
CPC .............. G11C 11/161; G11C 11/1673; G11C 11/1675; H01L 27/224; H01L 43/08
See application file for complete search history.

(56) References Cited

U.S. PATENT DOCUMENTS

| 6,639,831 B1* | 10/2003 | Pancholy | B82Y 10/00 365/158 |
| 6,697,294 B1* | 2/2004 | Qi | G11C 11/16 365/158 |
| 10,199,083 B1* | 2/2019 | Bozdag | H01L 43/08 |
| 2002/0141232 A1* | 10/2002 | Saito | G11C 11/1675 365/158 |

(Continued)

OTHER PUBLICATIONS

Herner et al., "Polysilicon Memory Switching: Electrothermal-Induced Order," IEEE Transactions on Electron Devices 53:9, Sep. 2006, pp. 2320-2327.

(Continued)

*Primary Examiner* — Mushfique Siddique
(74) *Attorney, Agent, or Firm* — Zilka & Kotab, P.C.

(57) ABSTRACT

A magnetic memory device that includes magnetic read elements and magnetic reference cells. The magnetic reference cells include magnetic tunnel junction elements having the same construction as the magnetic read elements. The reference cells produce a reference signal that can be compared with a read signal from the magnetic read element to determine whether the read element is in a high or low resistance state. During creation of the reference signal, the current passes in such a way so that reference cells are forced to be in the right state while causing no disturbance to the reference cell. The reference cell includes magnetic tunnel junction elements and also includes circuitry configured to produce a magnetic field that biases the magnetic tunnel junction elements of the reference cell into a desired magnetic state to ensure that the desired magnetic state of the reference cell magnetic tunnel junction elements is maintained.

17 Claims, 7 Drawing Sheets

(56) References Cited

U.S. PATENT DOCUMENTS

| | | | | | |
|---|---|---|---|---|---|
| 2008/0253173 | A1* | 10/2008 | Shimizu | ............... | G11C 11/16 365/158 |
| 2008/0279027 | A1* | 11/2008 | Boeve | ............... | G11C 7/04 365/210.1 |
| 2012/0051122 | A1* | 3/2012 | Tsuji | ............... | H01L 27/228 365/158 |
| 2013/0051122 | A1* | 2/2013 | Mori | ............... | G11C 13/004 365/148 |
| 2014/0119105 | A1* | 5/2014 | Jan | ............... | G11C 11/16 365/158 |
| 2017/0092345 | A1* | 3/2017 | Fukuzawa | ............... | H01L 43/08 |
| 2019/0115060 | A1* | 4/2019 | Deshpande | ............... | G11C 11/1673 |

OTHER PUBLICATIONS

Bulle-Lieuwma et al., "Microstructure of Heteroepitaxial Si/CoSi2/Si formed by Co Implantation into (100) and (111) Si," Appl. Phys. Lett. 54, 244, 1998, 3 pages.

Van Ommen et al., "Ion Beam Synthesis of Heteroepitaxial Si/CoSi2/Si Structure," Journal of Applied Physics 67:1767, 1990, 12 pages.

Capogreco et al., "Integration and Electrical Evaluation of Epitaxially Grown Si and SiGe Channels for Vertical NAND Memory Applications," 2015 IEEE International Memory Workshop, May 17-20, 2015, 5 pages.

Jang et al., "Polycrystalline silicon produced by Ni-silicide mediated crystallization of amorphous silicon in an electric field," Journal of Applied Physics 88:3099, 2000, 4 pages.

Kim et al., "Three-dimensional crystalline Si film growth by the Ni silicide mediation," Appl. Phys. Lett. 92:043501, 2008, 4 pages.

Jang et al., "Electric-held-enhanced Crystallization of Amorphous Silicon," Nature Letters vol. 395, Oct. 1, 1998, 3 pages.

Sohn et al., "Crystalline orientation of polycrystalline silicon with disklike grains produced by silicide-mediated crystallization of amorphous silicon," J Appl. Phys. 94:4326, 2003, 7 pages.

* cited by examiner

MRAM ARRAY HAVING REFERENCE CELL STRUCTURE AND CIRCUITRY THAT REINFORCES REFERENCE STATES BY INDUCED MAGNETIC FIELD

FIELD OF THE INVENTION

The present invention relates to magnetic random-access memory (MRAM) and more particularly to an MRAM array having a reference cell structure that is reinforced by the reference current direction and/or electrical current induced magnetic field.

BACKGROUND

Magnetic Random-Access Memory (MRAM) is a non-volatile data memory technology that stores data using magnetoresistive cells such as Magnetoresistive Tunnel Junction (MTJ) cells. At their most basic level, such MTJ elements include first and second magnetic layers that are separated by a thin, non-magnetic layer such as a tunnel barrier layer, which can be constructed of a material such as Mg—O. The first magnetic layer, which can be referred to as a reference layer, has a magnetization that is fixed in a direction that is perpendicular to that plane of the layer. The second magnetic layer, which can be referred to as a magnetic free layer, has a magnetization that is free to move so that it can be oriented in either of two directions that are both generally perpendicular to the plane of the magnetic free layer. Therefore, the magnetization of the free layer can be either parallel with the magnetization of the reference layer or anti-parallel with the direction of the reference layer (i.e. opposite to the direction of the reference layer).

The electrical resistance through the MTJ element in a direction perpendicular to the planes of the layers changes with the relative orientations of the magnetizations of the magnetic reference layer and magnetic free layer. When the magnetization of the magnetic free layer is oriented in the same direction as the magnetization of the magnetic reference layer, the electrical resistance through the MTJ element is at its lowest electrical resistance state. Conversely, when the magnetization of the magnetic free layer is in a direction that is opposite to that of the magnetic reference layer, the electrical resistance across the MTJ element is at its highest electrical resistance state.

The switching of the MTJ element between high and low resistance states results from electron spin transfer. An electron has a spin orientation. Generally, electrons flowing through a conductive material have random spin orientations with no net spin orientation. However, when electrons flow through a magnetized layer, the spin orientations of the electrons become aligned so that there is a net aligned orientation of electrons flowing through the magnetic layer, and the orientation of this alignment is dependent on the orientation of the magnetization of the magnetic layer through which they travel. When the orientations of the magnetizations of the free and reference layer are oriented in the same direction, the majority spin of the electrons in the free layer is in the same direction as the orientation of the majority spin of the electrons in the reference layer. Because these electron spins are in generally the same direction, the electrons can pass relatively easily through the tunnel barrier layer. However, if the orientations of the magnetizations of the free and reference layers are opposite to one another, the spin of majority electrons in the free layer will be generally opposite to the majority spin of electrons in the reference layer. In this case, electrons cannot easily pass through the barrier layer, resulting in a higher electrical resistance through the MTJ stack.

Because the MTJ element can be switched between low and high electrical resistance states, it can be used as a memory element to store a bit of data. For example, the low resistance state can be read as a "0", whereas the high resistance state can be read as a "1". In addition, because the magnetic orientation of the magnetic free layer remains in its switched orientation without any electrical power to the element, it provides a robust, non-volatile data memory bit.

To write a bit of data to the MTJ cell, the magnetic orientation of the magnetic free layer can be switched from a first direction to a second direction that is 180 degrees from the first direction. This can be accomplished, for example, by applying a current through the MTJ element in a direction that is perpendicular to the planes of the layers of the MTJ element. An electrical current applied in one direction will switch the magnetization of the free layer to a first orientation, whereas switching the direction of the current such that it is applied in a second direction will switch the magnetization of the free layer to a second, opposite orientation. Once the magnetization of the free layer has been switched by the current, the state of the MTJ element can be read by reading a voltage across the MTJ element, thereby determining whether the MTJ element is in a "1" or "0" bit state. Advantageously, once the switching electrical current has been removed, the magnetic state of the free layer will remain in the switched orientation until such time as another electrical current is applied to again switch the MTJ element. Therefore, the recorded data bit is non-volatile in that it remains intact in the absence of any electrical power.

SUMMARY

The present invention provides a magnetic memory apparatus that includes a reference cell structure that includes 4 magnetic tunnel junction elements: 2 low state MTJs connected in parallel and 2 high state MTJs connected in parallel, and these 2 low state and 2 high state magnetic elements are connected in series in such a way that a reference signal is generated. The magnetic memory apparatus also includes circuitry that is configured to produce a magnetic field that reinforces a desired magnetic state of the magnetic tunnel junction element.

The magnetic memory apparatus can include: a comparator; at least one memory element connected with the comparator, the memory cell being configured to send a read signal to the comparator; and at least one reference cell structure connected with the comparator, the reference cell structure being configured to send a reference signal to the comparator for comparison with the read signal from the memory element. The reference cell structure can include: a first pair of magnetic tunnel junction elements at low resistance state connected in parallel with one another; a second pair of magnetic tunnel junction elements at high resistance state connected in parallel with one another, the second pair of magnetic tunnel junction elements being connected in series with the first pair of magnetic tunnel junction elements; and circuitry configured to generate a magnetic field that biases a magnetization of the first pair of magnetic tunnel junction elements in a first direction and that biases a magnetization of the second pair of magnetic tunnel junction elements in a second direction that is opposite to the first direction. The generated reference signal is configured to be in the write direction of both pairs of magnetic junction elements.

The magnetic memory apparatus can include first and second arrays, wherein each of the arrays includes a plurality of memory elements and a plurality of reference cells. The first and second arrays can be connected with a comparator. A read signal can be read from a memory element of the first array while a reference signal can be read from a reference cell of the second array. The read signal and reference signal can be compared by the comparator to determine whether the read signal indicates that the memory element is in a high resistance or low resistance state.

The reference cell can include circuitry that is configured to generate a magnetic field that reinforces the desired magnetic state of the magnetic tunnel junction (MTJ) elements making up the reference cell. For example, as described above, one embodiment includes a first pair of magnetic memory elements that are magnetized in a first state (e.g. high low resistance state), and a second pair of magnetic tunnel junction elements that are magnetized in a second state (e.g. high resistance state). In order to function properly to generate an accurate reference signal, these magnetic tunnel junction elements should maintain their desired magnetizations.

The magnetic field from the circuitry reinforces the desired magnetization of the magnetic tunnel junction elements by generating a magnetic field that helps to keep the magnetic free layer of each of the reference cell magnetic tunnel junctions magnetized in the desired direction. The circuitry can include a pair of electrically conductive lines that travel adjacent to and around each of the first and second pairs of magnetic tunnel junctions. The electrically conductive lines can be arranged on opposite sides of the first pair of magnetic tunnel junction elements and can have electrical currents that flow in opposite directions relative to one another. The path of the electrically conductive lines can cross over one another at some location between the first and second pairs of magnetic tunnel junction elements so as to be oriented on opposite sides of the second pair, relative to the first pair.

The magnetic field created with electrical current can assist writing to the reference cells such that lower current is required to write to the cells. Using lower current in the magnetic field assist reference cells will improve the endurance of the reference cells.

The writing of the reference cells can be thought of as a refreshing of the reference cells and it can be done periodically. An internal chip clock can be used to set up the periodicity of the refresh time.

These and other features and advantages of the invention will be apparent upon reading of the following detailed description of the embodiments taken in conjunction with the figures in which like reference numeral indicate like elements throughout.

BRIEF DESCRIPTION OF THE DRAWINGS

For a fuller understanding of the nature and advantages of this invention, as well as the preferred mode of use, reference should be made to the following detailed description read in conjunction with the accompanying drawings which are not to scale.

DETAILED DESCRIPTION

The following description is of the best embodiments presently contemplated for carrying out this invention. This description is made for the purpose of illustrating the general principles of this invention and is not meant to limit the inventive concepts claimed herein.

Figure 1:
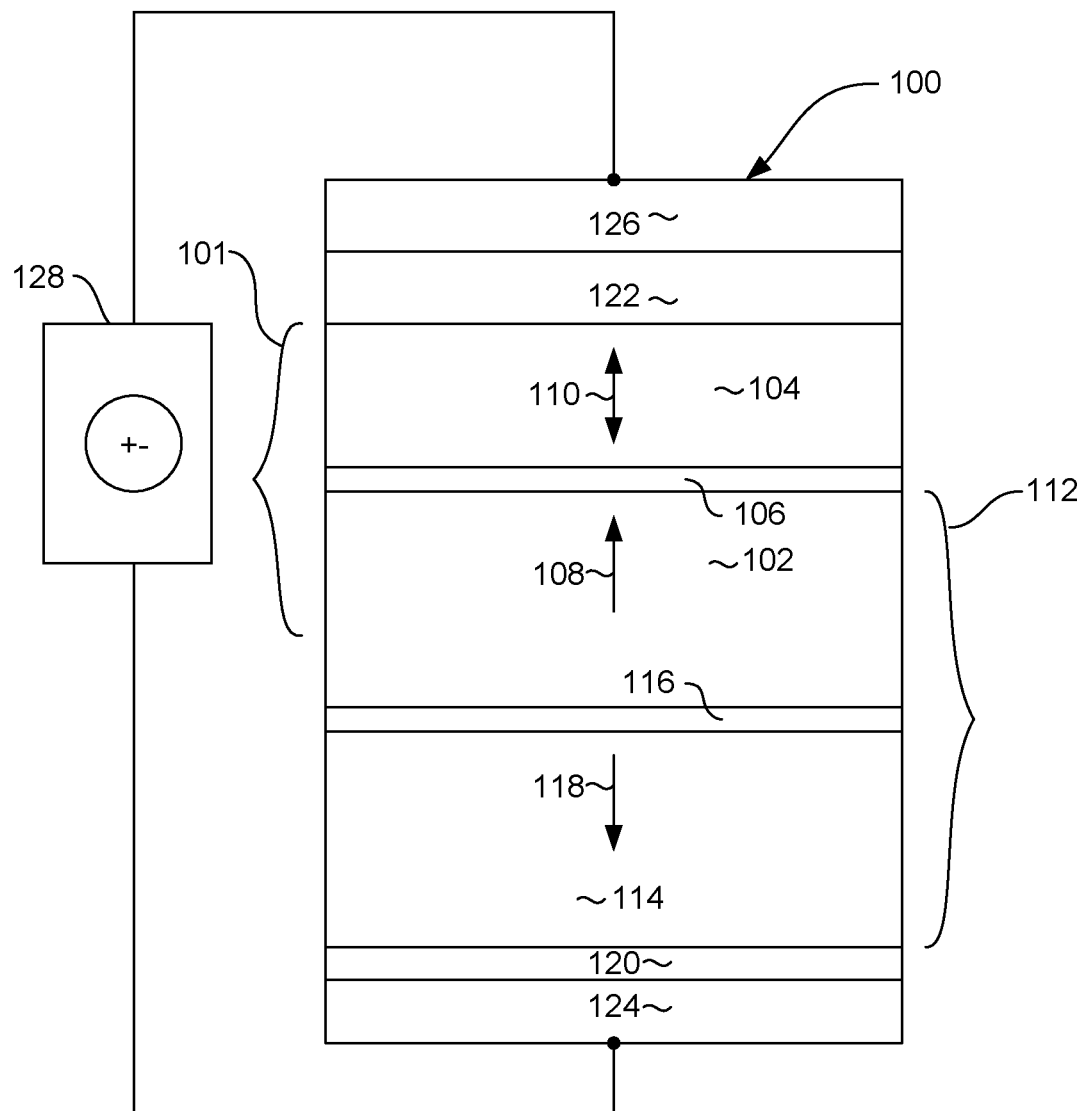
FIG. 1 is a schematic, cross sectional view of a perpendicular magnetic tunnel junction (pMTJ) element.

Referring now to FIG. 1, a magnetic memory element 100 can be in the form of a perpendicular magnetic tunnel junction (pMTJ) memory element. The magnetic memory element can include an MTJ 101 that can include a magnetic reference layer 102, a magnetic free layer 104 and a thin, non-magnetic, electrically insulating magnetic barrier layer 106 located between the magnetic reference layer 102, and magnetic free layer 104. The barrier layer 106 can be an oxide such as MgO. The magnetic reference layer has a magnetization 108 that is fixed in a direction that is preferably perpendicular to the plane of the layers as indicated by arrow 108. The magnetic free layer 104 has a magnetization 110 that can be in either of two directions perpendicular to the plane of the layer 104. While the magnetization 110 of the free layer 104 remains in either of two directions perpendicular to the plane of the layer 104 in a quiescent state, it can be moved between these two directions as will be described in greater detail herein below. When the magnetization 110 of the magnetic free layer 104 is in the same direction as the magnetization 108 of the reference layer 102, the electrical resistance across the layers 102, 106, 104 is at a low resistance state. Conversely, when the magnetization 110 of the free layer 104 is opposite to the magnetization 108 of the reference layer 102, the electrical resistance across the layers 102, 106, 104 is in a high resistance state.

The magnetic reference layer 102 can be part of an anti-parallel magnetic pinning structure such as a Synthetic Anti-Ferromagnet (SAF) 112 that can include a magnetic balancing bottom layer 114, and a non-magnetic, antiparallel coupling layer (such as Ru) 116 located between the bottom SAF layer 114 and reference layer 102. The antiparallel coupling layer 116, which will be described in greater detail herein below, can be constructed to have a composition and thickness such that it will couple the layers 114, 102 in an antiparallel configuration. The antiparallel coupling between the layers 114, 102 ensures that the magnetization 108 of the reference layer 102 is in a direction opposite to the direction of magnetization 118 of the bottom SAF layer 114.

A seed layer 120 may be provided near the bottom of the memory element 100 to initiate a desired crystalline structure in the above deposited layers. A capping layer 122 may be provided near the top of the memory element 100 to protect the underlying layers during manufacture, such as during high temperature annealing and from exposure to ambient atmosphere. Also, electrodes 124, 126 may be provided at the bottom and top of the memory element 100. The electrodes 124, 126 may be constructed of a non-magnetic, electrically conductive material such as one or more of Ta, W, Cu and Al can provide electrical connection with circuitry 128 that can include a current source and can further include circuitry such as CMOS circuitry for reading an electrical resistance across the memory element 100.

The magnetic free layer 104 has a perpendicular magnetic anisotropy that causes the magnetization 110 of the free layer 104 to remain stable in one of two directions perpendicular to the plane of the free layer 104. In a write mode, the orientation of the magnetization 110 of the free layer 104 can be switched between these two directions by applying an electrical current through the memory element 100 from the circuitry 128. A current in one direction will cause the memory element to flip to a first orientation, and a current in an opposite direction will cause the magnetization to flip to a second, opposite direction. For example, if the magnetization 110 is initially oriented in a downward direction in FIG. 1, applying a current in a downward direction through the element 100 will cause electrons to flow in an opposite direction upward through the element 100. The electrons travelling through the reference layer will become spin polarized as a result of the magnetization 108 of the reference layer 102. These spin polarized electrons cause a spin torque on the magnetization 110 of the free layer 104, which causes the magnetization to flip directions.

On the other hand, if the magnetization 110 of the free layer 104 is initially in an upward direction in FIG. 1, applying an electrical current through the element 100 in an upward direction will cause electrons to flow in an opposite direction, downward through the element 100. However, because the magnetization 110 of the free layer 104 is opposite to the magnetization 108 of the reference layer 102, the electrons with an opposite spin will not be able to efficiently pass through the barrier layer 106 to the reference layer 102. As a result, the electrons having an opposite spin will be reflected at barrier layer 106, and return to the free layer 104 with a spin polarization opposite that of the reference layer 102. These spin polarized electrons cause a spin torque that causes the magnetization 110 of the free layer 104 to flip from an upward direction to a downward direction.

In order to read data recorded to memory elements of a magnetic random access memory system, the system must be able to distinguish whether each of the memory elements is in a high or low resistance state. This can be accomplished by applying a voltage across the memory element and then detecting the resulting amount of electrical current flowing through the memory element. This electrical current is compared with a reference value in order to determine whether the electrical current is above or below this reference value. If the current is above the reference value, then the memory element is in a low resistance state (read as a "1"). Conversely, if the electrical current is less than the reference value, then the memory element is in a high resistance state (read as a "0").

However, the resistance values of a memory element can vary as a result of several factors. For example, the high and low resistance values of a magnetic memory element can vary with temperature and can vary as a result of manufacturing variations and variations related to the memory element's location in an array or on the wafer on which it was manufactured. Therefore, in order to accurately determine the memory state of a memory element, it is desirable to periodically determine the reference voltage in a manner that takes into account variations in the actual memory state of the memory element.

Figure 2:
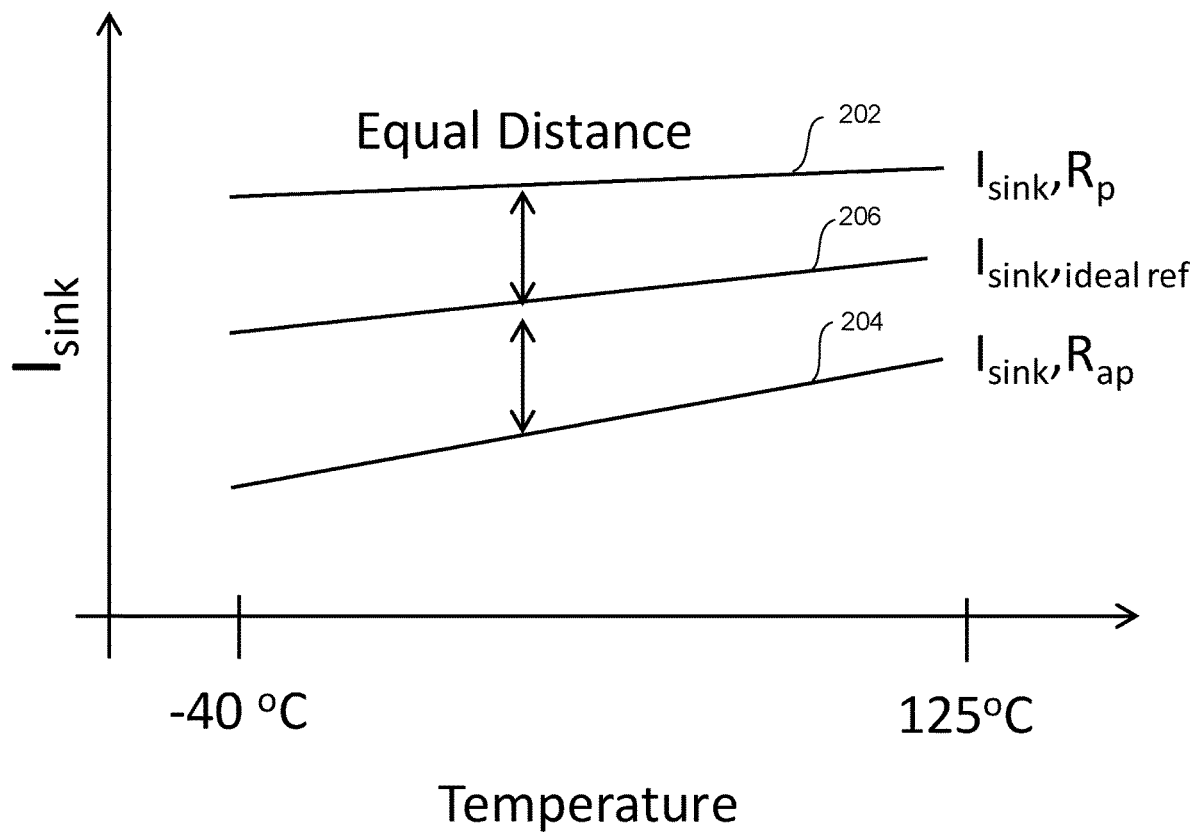
FIG. 2. is a graph illustrating the relationship between sink current and temperature for a perpendicular magnetic tunnel junction (pMTJ) memory element for a high resistance state, a low resistance state and a reference state.

FIG. 2 is a graph illustrating how current (Isink) through a pMTJ memory element varies with temperature. Line 202 shows the current through the memory element for a low resistance state (i.e. when the magnetic free layer and magnetic reference layer are magnetized in the same direction (Rp)). Line 204 shows the current through the memory element as a function of temperature for the memory element in the high resistance state (i.e. when the magnetic free layer is magnetized opposite to the magnetic reference layer (Rap)). As can be seen, the current in the low resistance state (line 202) and the current in the high resistance state (line 204) both increase substantially linearly with temperature. Line 206 shows the reference current value. The reference current 206 is ideally located equidistant between the low resistance state 202 and high resistance state 204. As can be seen, then, the reference current also increases substantially linearly with temperature. This temperature dependence of the reference current 206 is by way of example. As discussed above, other factors can affect a variation in the reference current value, such as manufacturing variation or location of the memory element. Therefore, it is desirable to periodically or continuously determine the actual reference current value in order to read the magnetic state of a memory element in a magnetic memory array.

Figure 3:
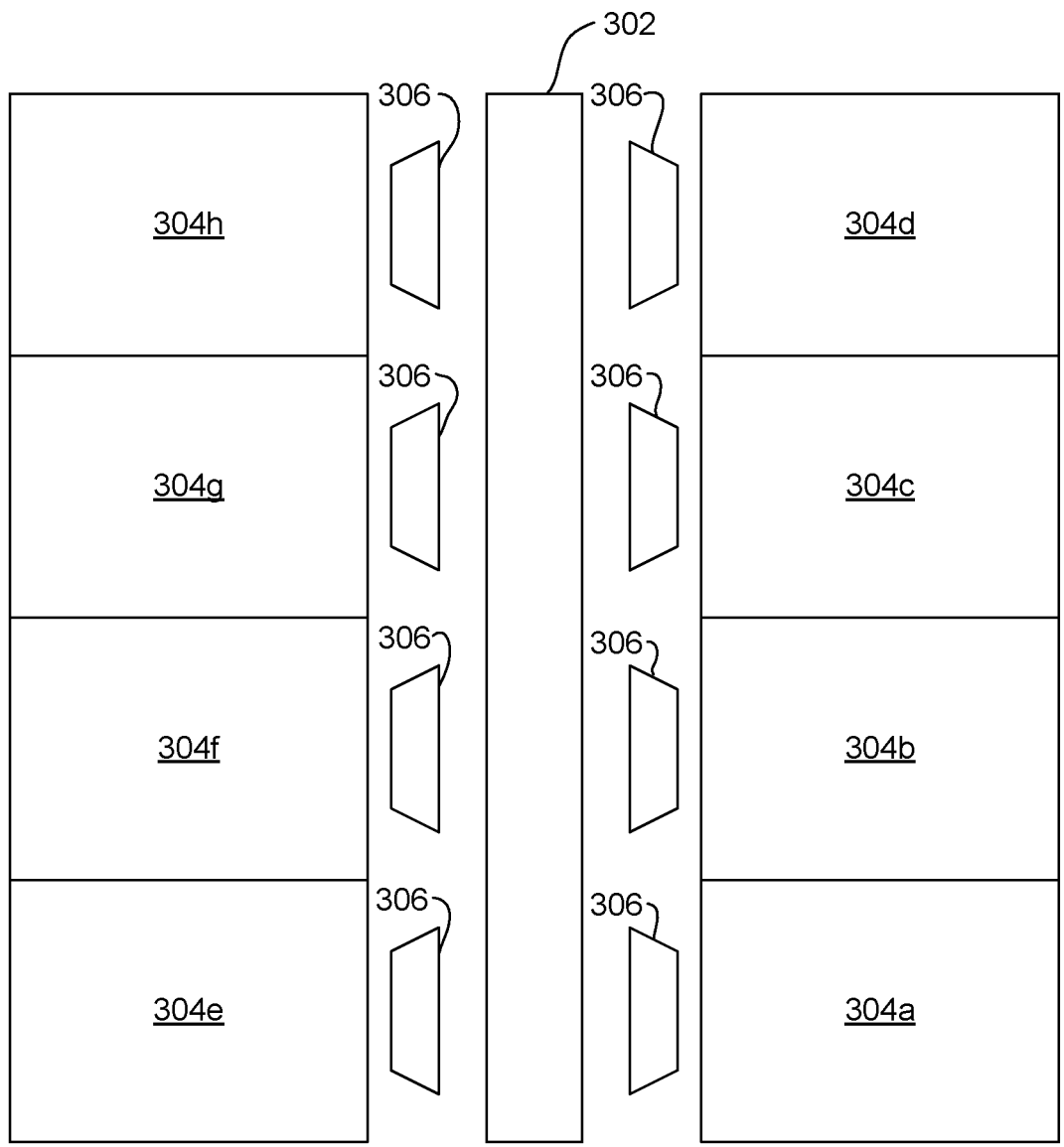
FIG. 3 is a schematic illustration of a memory input output (IO) structure having multiple memory arrays.

FIG. 3 is a schematic illustration of an input/output (TO) structure of a magnetic memory array. The IO structure includes SA biasing circuitry 302 for driving a series of memory arrays 304a-h, which can be arranged in a mirror image fashion at opposite sides of the biasing circuitry 302. Each of the memory arrays 304 can be electrically connected with a multiplexer 306, which selects signals from one or more memory element of the associated memory array 304 and delivers these signals between the associated memory array 304 and the circuitry 302.

Figure 4:
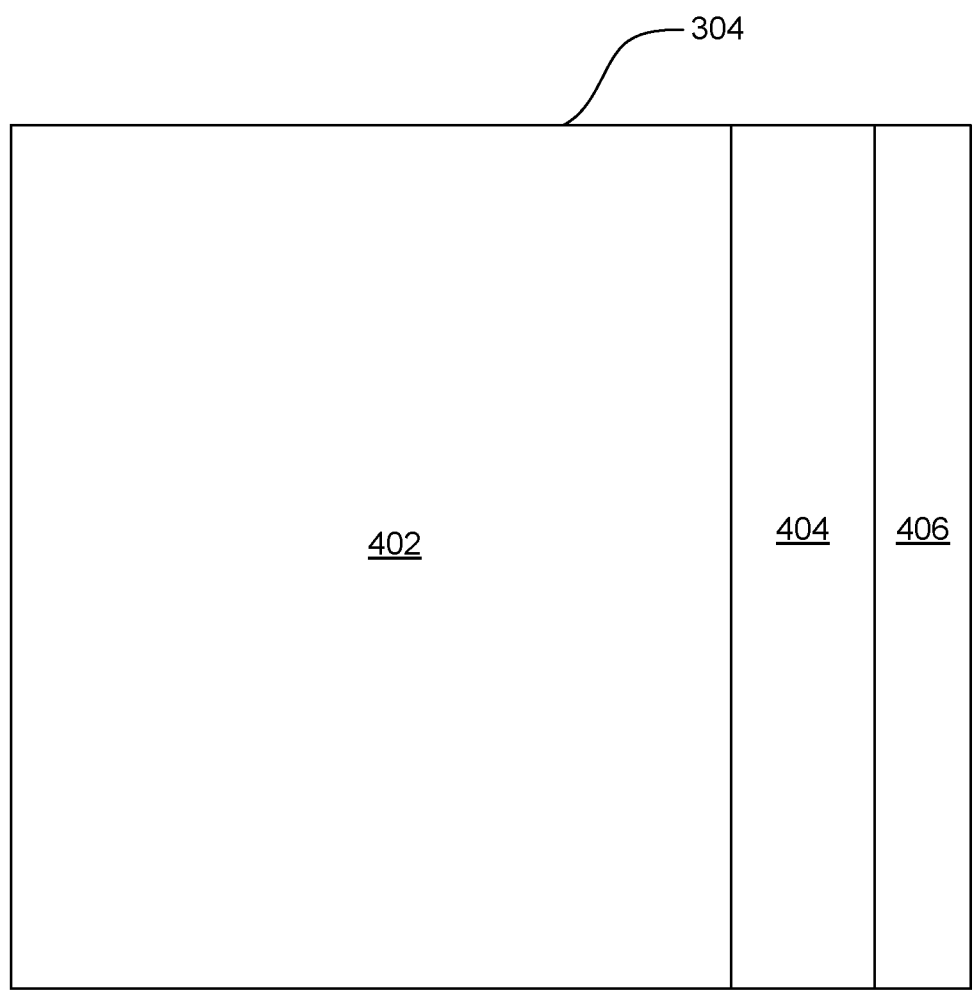
FIG. 4 is an enlarged, schematic view of a memory array of the IO structure of FIG. 3.

FIG. 4 shows an enlarged view of one of the memory element arrays 304 of FIG. 3. The memory element array 304 can include an array 402 of memory columns that include data memory elements used for storing and reading data. The memory element portion 402 may make up a majority of the array 304. The array 304 also includes an array of reference columns 404 which can be controlled by a reference driver 406. An example of reference cells in the reference array 404 according to an embodiment will be described in greater detail herein below. As can be seen with reference to FIGS. 3 and 4, each of the memory arrays 304 as shown in FIG. 3 can include a reference cell array 404 and reference driver 406 as well as an array 402 of memory elements. Also, as shown in FIG. 3, these memory arrays 304 can be arranged as mirror images across the circuitry 302. Therefore, a reference current signal can be read from a memory array (e.g. 304a) while reading a data signal from an opposite memory array (e.g. 304e), in order to accurately read a data signal (e.g. from memory array 304e).

Figure 5:
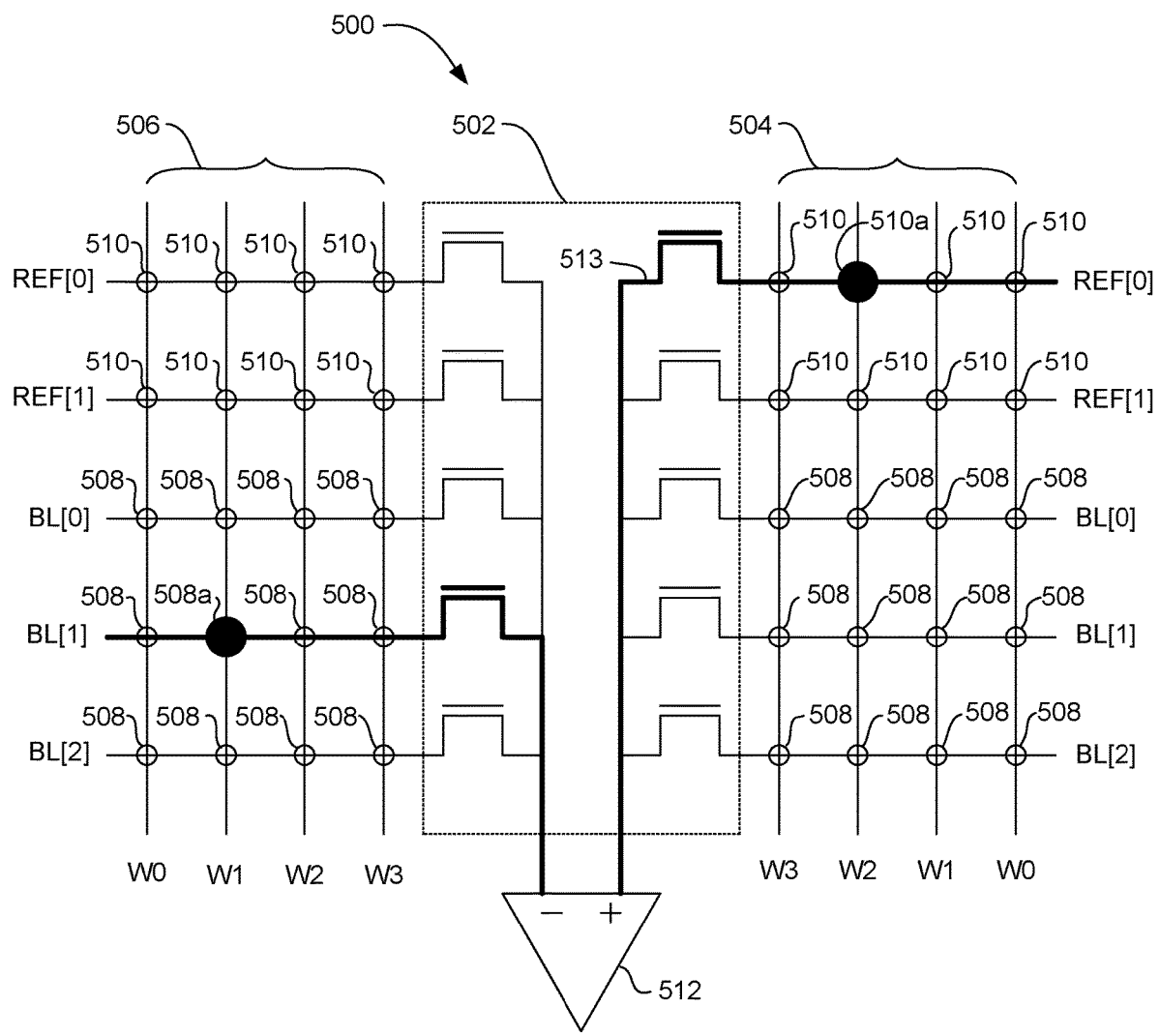
FIG. 5 is a schematic illustration of an IO array with a reference cell structure for calibrating a reference current for reading data.

FIG. 5 is a schematic illustration of sensing circuitry 500. The circuitry 500 can include a sensing block 502. Memory arrays 504, 506 are formed at either side of the sensing block 502, and may be symmetrically arranged at either side of the sensing block 502. Each of the arrays 504, 506 can correspond to the arrays 304 of FIGS. 3 and 4. Each array 504, 506 includes reference lines REF[0], REF[1], and bit lines BL[0], BL[1], BL[2], and also includes a series of word lines W0, W1, W2, W3. The number of reference lines, bit lines and word lines in FIG. 5 is by way of example only, and many more or even fewer reference lines, bit lines and word lines could be included in each array 504, 506. A magnetic memory cell 508 is associated with the junction of each bit line with a word line. Similarly, a reference cell 510 is associated with the junction of each reference line with a word line.

Each of the arrays 504, 506 is connected with a comparator 512, through the sensing block 502 so that a signal from one array (e.g. 504) can be compared with a signal from the opposite array (e.g. 506). Each reference cell 510 (a structure for which will be further described herein below) is configured to produce a reference current. As discussed above with reference to FIG. 2, the reference current signal is a signal that is at a halfway point between a high resistance state and a low resistance state of a memory cell 508 of the array. A reference current signal can be read from a selected reference cell (510*a*) to determine a reference current value. This reference signal is passed to the comparator 512 through a circuit indicated by bold line 513. In addition, a read signal can be read from a memory cell 508*a* and passed to the comparator 512. Desirably, the reference cell 510*a* from which the reference signal is read is in the array (e.g. 504) that is opposite the array (e.g. 506) in which the memory cell 508*a* is located. The comparator 512 receives the signal from the memory cell 508*a* and compares this signal to the reference signal from the reference element 510*a* to determine whether the memory cell 508*a* is in a high or low resistance state (e.g. 0 or 1).

Figure 6:
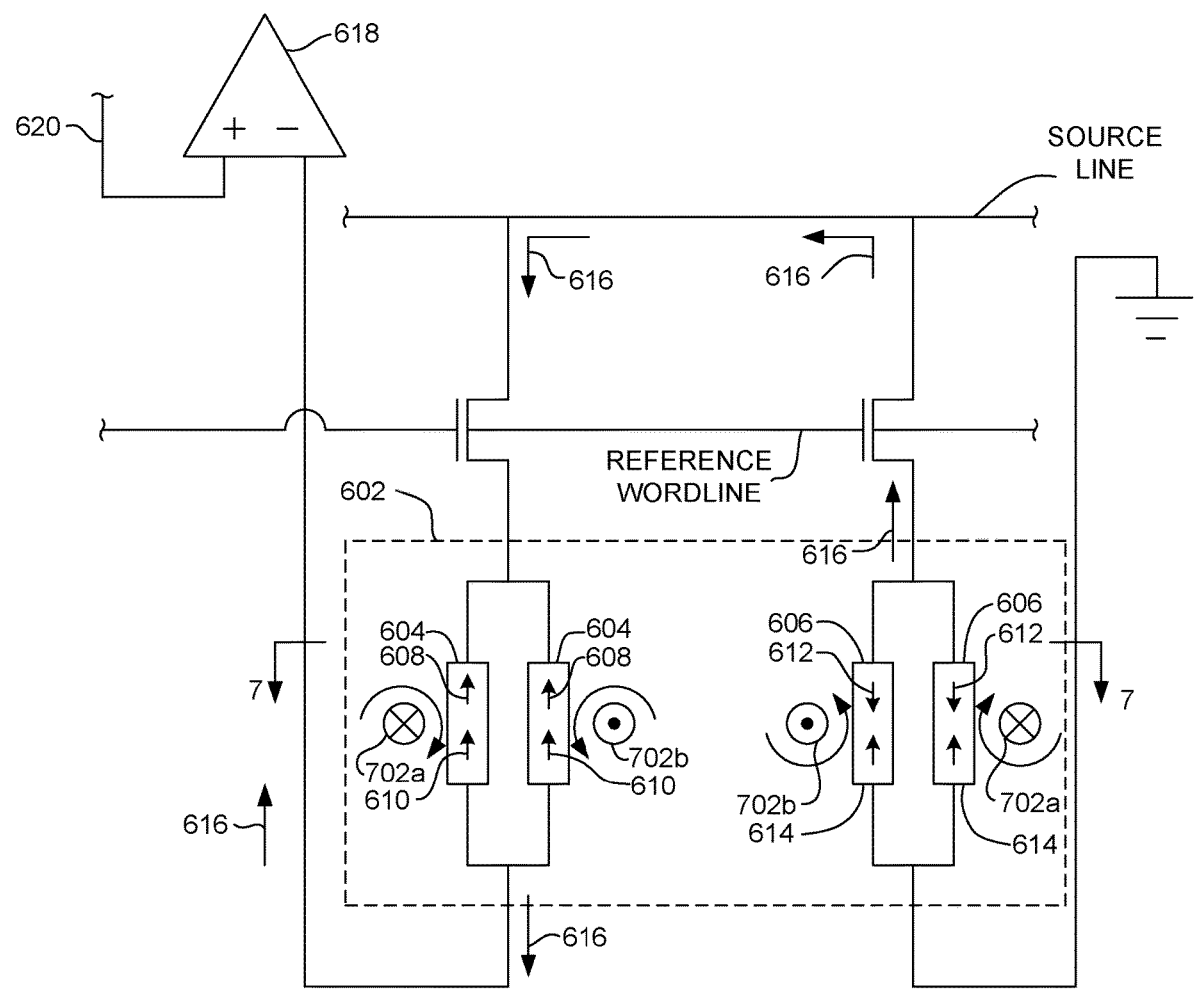
FIG. 6 is a schematic illustration of a reference cell structure according to an embodiment.

FIG. 6 is a schematic illustration of reference cell structure 602, such as might be used as a memory cell 510 of the circuitry of FIG. 6. The reference cell structure 602 includes a first pair of MTJ cells 604 connected in parallel with one another, and a second pair of MTJ cells 606 connected in parallel with one another. Each of the MTJ elements of the first and second pairs of MTJ cells 604, 606 has a structure that is the same as or similar to that of a magnetic memory element for which the reference cell 602 provides a reference voltage.

The first pair of MTJ cells 604 is set to a low resistance state, wherein the magnetic free layer is magnetized in the same direction as the reference layer as indicated by arrows 608 and 610. Conversely, the second set of MTJ elements 606 is set to a high resistance state wherein the magnetic free layer is magnetized in an opposite (antiparallel) direction relative to the reference layer as indicated by arrows 612, 614. The first and second pairs of MTJ elements are connected in series with one another along a bitline path indicated by arrow 616, which can deliver a signal of the series connected pairs of MTJ elements to a comparator 618. A second connection with the comparator 618 is connected with a memory element cell (not shown) by a line 620, for comparison with a reference cell signal.

As discussed above, the reference signal is desirably an average of the high resistance state of a memory element and low resistance state of the memory element (i(ref)=[i(high resistance)+i(low resistance)]/2. Therefore, the reference current is I(ref)=V(read)/((R(high)+R(low)/2), where I(ref) is the reference current, V(read) is a read voltage, R(high) is the resistance of the high resistance state MTJs 606, and R(low) is the resistance of the low resistance state MTJs 604.

As seen in FIG. 6, because the first pair of MTJ elements 604 are connected in parallel, the combined resistance of these MTJ elements 604 is half of the resistance of a single MTJ element 604. Similarly, since the MTJ elements 606 are connected in parallel the combined resistance of these elements 606 is half of the resistance of a single MTJ element 606. Since the pairs 604, 606 are connected in series with one another along line 616, the total combined resistance is ½(R(high)+½(R(low)). Therefore, when a read voltage is applied along the line path 616, the current sent to the comparator 618 is a perfect reference voltage (the average of the high and low resistance states for the MTJs 604, 606.

As can be seen, in order for the reference cell 602 to function properly to provide an accurate reference voltage, the magnetic orientation (resistance state) of each of the elements 604, 606 must be maintained in the desired direction. However, various factors such as external or internal magnetic fields or thermal stress can cause the magnetic state of the magnetic free layer in each of these elements 604, 606 to flip direction. This would then cause the reference cell 602 to provide an inaccurate reference current. In order to ensure that the MTJ elements 604, 606 are magnetized in the correct direction, a write current can be passed through the elements 604, 606 in a desired direction to re-set the magnetizations of the MTJ elements 604, 606. This resetting can be performed at power-up and also occasionally during use.

Optimally, however, it is desirable that the memory elements 604, 606 maintain their desired magnetic/resistance state without the need for re-setting. This ensures that the correct reference current is maintained between re-setting procedures, and also reduces the need for conducting re-setting procedures. The present invention provides a structure for reinforcing the MTJ states so that the correct magnetic orientations of the MTJ elements 604, 606 is maintained between or in lieu of re-setting procedures.

Figure 7:
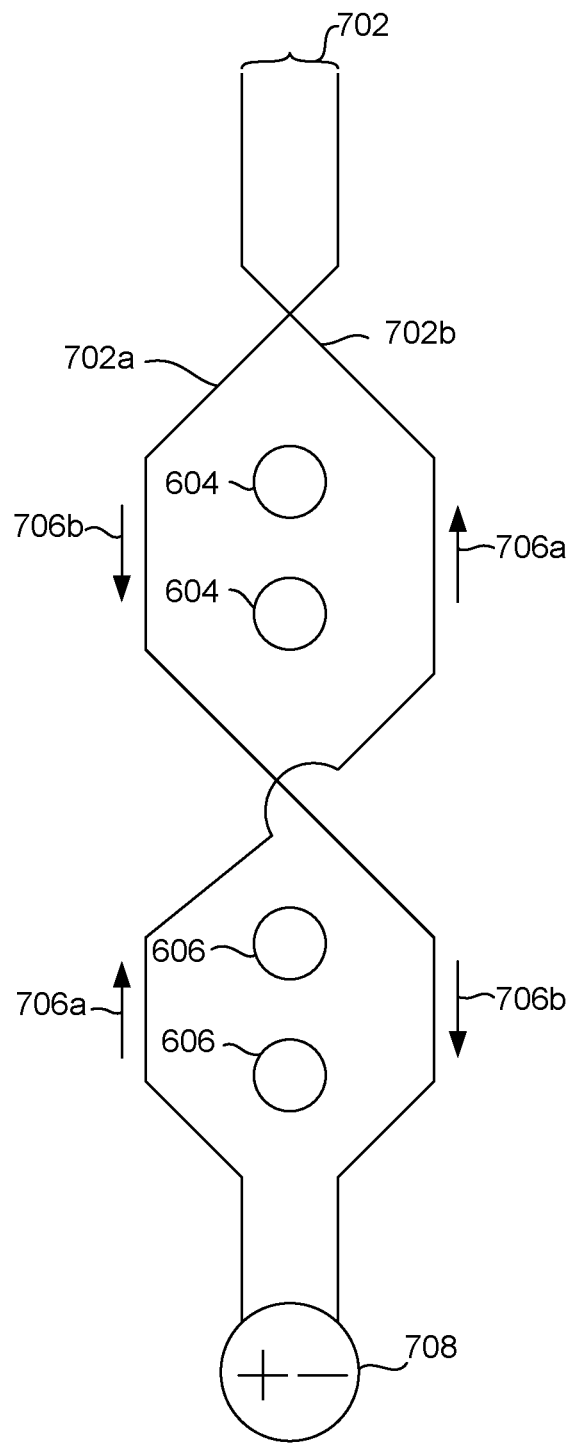
FIG. 7 is an enlarged schematic view taken from line 7-7 of FIG. 6, showing a biasing circuit structure for maintaining a desired magnetization in memory elements of a reference cell structure.

FIG. 7 is a top-down, schematic view as seen from line 7-7 of FIG. 6. As seen in FIGS. 6 and 7, the memory cell 602 includes magnetic reinforcing circuitry 702. The configuration of the circuitry 702 can be seen more clearly in the top down view of FIG. 7. As can be seen, the circuitry 702 includes a first line 702*a* and a second line 702*b*, both of which travel in a serpentine configuration about the sets of memory elements 604, 606. Each of the lines 702*a*, 702*b* travels adjacent to the MTJ elements 604, 606. The lines 702*a*, 702*b* can be connected with a voltage or current source 708. When an electrical current flows through the lines 702*a*, 702*b* a magnetic field is generated about the lines 702*a*, 702*b* as indicated by arrows 704. The lines 702*a*, 702 are arranged such that the magnetic field 704 is oriented so as to reinforce the desired magnetization in each of the MTJ cells 606, 604. As shown in FIG. 7, the lines 702*a*, 702*b* are located on opposite sides of each pair of MTJ elements 604, 606 in such a manner that the magnetic field from each line 702*a*, 702*b* reinforces the desired magnetization of adjacent MTJ element. This also means that current flowing through one line (e.g. 702*a*) will be flowing in a direction opposite to that of the other line (e.g. 702*b*) as indicated by arrows 706*a*, 706*b*. It can also be seen that the lines 702*a*, 702*b* cross over one another at a location between the first and second pairs of MTJ elements 604, 606 so that each line will be on an opposite side of one pair (e.g. 604) than it was on the other pair (e.g. 606). In this way the lines 702*a*, 702*b* can reinforce a first direction of magnetization in the first pair 604, while reinforcing an opposite magnetization in the other pair 606.

The above magnetization reinforcing circuitry 702*a*, 702*b* advantageously reinforces the maintenance of a desired magnetization and switching state of the MTJ elements of the reference cell structure 602, thereby ensuring that an accurate reference signal is always sent to the comparator 618 (FIG. 6) for accurate data reading. The use of this magnetization reinforcing circuitry 702 can be in addition to or in lieu of various other methods for maintaining proper magnetization of the MTJ elements 604, 606, such as the application of a switching current to each of the reference cell MTJ elements 604, 606.

While various embodiments have been described above, it should be understood that they have been presented by way of example only and not limitation. Other embodiments falling within the scope of the invention may also become apparent to those skilled in the art. Thus, the breadth and scope of the inventions should not be limited by any of the above-described exemplary embodiments but should be defined only in accordance with the following claims and their equivalents.

What is claimed is:

1. A magnetic memory apparatus, comprising:
a reference cell structure including a magnetic tunnel junction element and circuitry formed adjacent to the magnetic tunnel junction element, the circuitry being configured to produce a magnetic field that reinforces a desired magnetic state of the magnetic tunnel junction element;
wherein the circuitry further comprises first and second electrically conductive lines formed on opposite sides of the magnetic tunnel junction element, wherein the first electrically conductive line is configured to have a current flowing in a first direction and the second electrically conductive line is configured to have a current flowing in a second direction that is opposite the first direction.

2. The magnetic memory apparatus as in claim 1, wherein the magnetic tunnel junction element is a first magnetic tunnel junction element having a first magnetic state, the reference cell structure further comprising a second magnetic tunnel junction element having a second magnetic state and wherein the circuitry is configured to produce a magnetic field that reinforces the first magnetic state of the first magnetic tunnel junction element and also to produce a magnetic field that reinforces the second magnetic state of the second magnetic tunnel junction element.

3. The magnetic memory apparatus as in claim 1, wherein the memory cell structure comprises a first pair of magnetic tunnel junction elements having a first magnetic state and connected in parallel with one another, a second pair of magnetic tunnel junctions having a second memory state and connected in parallel with one another, the first and second pairs of magnetic memory elements being connected in series with one another, and wherein the circuitry is configured to generate a magnetic field that reinforces the first magnetic state of the first pair of magnetic tunnel junction elements and to produce a magnetic field that reinforces the second magnetic state of the second pair of magnetic tunnel junction elements.

4. The magnetic memory apparatus as in claim 3, wherein the circuitry comprises first and second electrically conductive lines formed adjacent to first and second sides of the first pair of magnetic tunnel junction elements and adjacent to opposite first and second sides of the second pair of magnetic tunnel junction elements.

5. The magnetic memory apparatus as in claim 1, further comprising circuitry for supplying a write current to the first pair of magnetic tunnel junction elements to switch the first pair of magnetic tunnel junction elements to a low resistance state and for supplying a write current to the second pair of magnetic tunnel junctions to switch the second pair of magnetic tunnel junction elements to a high resistance state.

6. A magnetic memory apparatus, comprising:
a comparator;
at least one memory element connected with the comparator, the memory element being configured to send a read signal to the comparator;
at least one reference cell connected with the comparator, the reference cell being configured to send a reference signal to the comparator for comparison with the read signal from the memory element, the reference structure comprising:
a first pair of magnetic tunnel junction elements connected in parallel with one another;
a second pair of magnetic tunnel junction elements, the second pair of magnetic tunnel junction elements being connected in series with the first pair of magnetic tunnel junction elements; and
circuitry configured to generate a magnetic field that biases a magnetization of the first pair of magnetic tunnel junction elements in a first direction and that biases a magnetization of the second pair of magnetic tunnel junction elements in a second direction that is opposite to the first direction;
wherein the circuitry includes an electrically conductive line that passes by a first side of the first pair of magnetic memory elements and a second, opposite side of the second pair of magnetic memory elements.

7. The magnetic memory element as in claim 6, wherein the circuitry includes first and second electrically conductive lines arranged adjacent to first and second sides of the first pair of magnetic tunnel junction elements and adjacent to opposite sides of the second pair of magnetic tunnel junction elements.

8. The magnetic memory apparatus as in claim 6, wherein the circuitry includes first and second electrically conductive lines formed adjacent to opposite sides of the first pair of magnetic tunnel junction elements and wherein the electrically conductive lines cross over one another before extending adjacent to opposite sides of the second pair of magnetic memory tunnel junction elements.

9. The magnetic memory apparatus as in claim 8, further comprising circuitry for supplying an electrical current in a first direction through the first electrically conductive line and to supply an electrical current in a second, opposite direction through the second electrically conductive line.

10. The magnetic memory apparatus as in claim 6, wherein the circuitry generates a magnetic field in a first direction at the location of the first pair of magnetic tunnel junction elements and in a second, opposite direction at the location of the second pair of magnetic memory elements.

11. The magnetic memory apparatus as in claim 6, further comprising circuitry for supplying a write current to the first pair of magnetic tunnel junction elements to switch the first pair of magnetic tunnel junction elements to a low resistance state and for supplying a write current to the second pair of magnetic tunnel junctions to switch the second pair of magnetic tunnel junction elements to a high resistance state.

12. A magnetic memory apparatus, comprising:
a first array comprising a plurality of magnetic memory elements and a plurality of reference cells;
a second array comprising a plurality of magnetic memory elements and a and a plurality of reference cells; and
a comparator connected with the first and second arrays; wherein
each of the memory cells comprises:
a first pair of magnetic tunnel junction elements connected in parallel with one another;

a second pair of magnetic tunnel junction elements connected in parallel with one another, the second pair of magnetic tunnel junction elements being connected in series with the first pair of magnetic tunnel junction elements; and circuitry configured to generate a magnetic field in a first direction at a location of the first pair of magnetic tunnel junction elements and in a second direction at a location of the second pair of magnetic memory elements;

wherein the circuitry comprises an electrically conductive line passing by a first side of the first pair of magnetic tunnel junction elements and a second side of the second pair of magnetic tunnel junction elements.

13. The magnetic memory apparatus as in claim 12, further comprising circuitry for delivering a read signal from a memory element of the first array to the comparator and for delivering a reference signal from a reference cell of the second array to the comparator.

14. The magnetic memory apparatus as in claim 12, further comprising circuitry configured to deliver a write current to each of the reference cells so as to switch the first pair of magnetic tunnel junction elements to a low resistance state and switch the second pair of magnetic tunnel junction elements to a high resistance state.

15. The magnetic memory apparatus as in claim 12, wherein the circuitry comprises first and second electrically conductive lines, the first electrically conductive line passing adjacent to a first side of the first pair of magnetic tunnel junction elements and a second side of the second pair of magnetic tunnel junction elements and the second electrically conductive line passing by a second side of the first pair of electrically conductive elements and a first side of the second pair of electrically conductive elements.

16. The magnetic memory apparatus as in claim 15, further comprising circuitry for delivering an electrical current through the first electrically conductive line in a first direction and for delivering an electrical current through the second electrically conductive line in a second direction opposite to the first direction.

17. The magnetic memory apparatus as in claim 12 further comprising refresh circuitry configured to periodically provide a write current to the first and second pairs of magnetic memory elements, the refresh circuitry including an internal chip clock.

* * * * *

UNITED STATES PATENT AND TRADEMARK OFFICE
CERTIFICATE OF CORRECTION

PATENT NO. : 10,847,199 B2
APPLICATION NO. : 16/362329
DATED : November 24, 2020
INVENTOR(S) : Kuk-Hwan Kim et al.

Page 1 of 1

It is certified that error appears in the above-identified patent and that said Letters Patent is hereby corrected as shown below:

In the Specification

Column 6, Line 28 please replace "TO" with --IO--.

In the Claims

Column 10, Line 62 please replace "and a and a" with --and a--.

Signed and Sealed this
Twentieth Day of April, 2021

Drew Hirshfeld
*Performing the Functions and Duties of the*
*Under Secretary of Commerce for Intellectual Property and*
*Director of the United States Patent and Trademark Office*